US012812832B2

(12) United States Patent
Yang

(10) Patent No.: US 12,812,832 B2
(45) Date of Patent: Nov. 24, 2026

(54) METHOD FOR SUPPLYING SMT-COMPONENTS WITHIN FEEDER CARTRIDGES, SUPPLY SYSTEM, COMPUTER PROGRAM PRODUCT AND COMPUTER-READABLE MEDIUM

(71) Applicant: ASMPT GmbH & Co. KG, Munich (DE)

(72) Inventor: Fuyan Yang, Munich (DE)

(73) Assignee: ASMPT GmbH & Co. KG (DE)

( * ) Notice: Subject to any disclaimer, the term of this patent is extended or adjusted under 35 U.S.C. 154(b) by 642 days.

(21) Appl. No.: 18/128,372

(22) Filed: Mar. 30, 2023

(65) Prior Publication Data

US 2023/0371223 A1 Nov. 16, 2023

(30) Foreign Application Priority Data

May 11, 2022 (DE) ..................... 10 2022 111 830.4

(51) Int. Cl.
*H05K 13/08* (2006.01)
*B65G 65/00* (2006.01)
(Continued)

(52) U.S. Cl.
CPC ........... *H05K 13/086* (2018.08); *B65G 65/00* (2013.01); *H05K 13/02* (2013.01); *H05K 13/021* (2013.01);
(Continued)

(58) Field of Classification Search
CPC .... H05K 13/086; H05K 13/02; H05K 13/021; H05K 13/0417; H05K 13/0419; H05K 13/046; B65G 65/00
See application file for complete search history.

(56) References Cited

U.S. PATENT DOCUMENTS

2017/0208713 A1 7/2017 Iisaka et al.
2021/0315139 A1 10/2021 Yasui

FOREIGN PATENT DOCUMENTS

EP 3843518 A1 6/2021
EP 3941174 A1 1/2022
(Continued)

OTHER PUBLICATIONS

JP-2005235952-A (Year: 2005).*
(Continued)

*Primary Examiner* — Ernesto A Suarez
*Assistant Examiner* — Laurence R Brothers
(74) *Attorney, Agent, or Firm* — OSTROLENK FABER LLP

(57) ABSTRACT

The invention relates to a method (200) for supplying SMT-components (12) within feeder cartridges (10) to a placement device (150) for the SMT-components (12), the placement device (150) having multiple slots (152) for installing the feeder cartridges (10) to transfer the SMT-components (12) from each of the feeder cartridges (10) to the placement device (150), the method (200) comprising the following steps:

Figure 1:
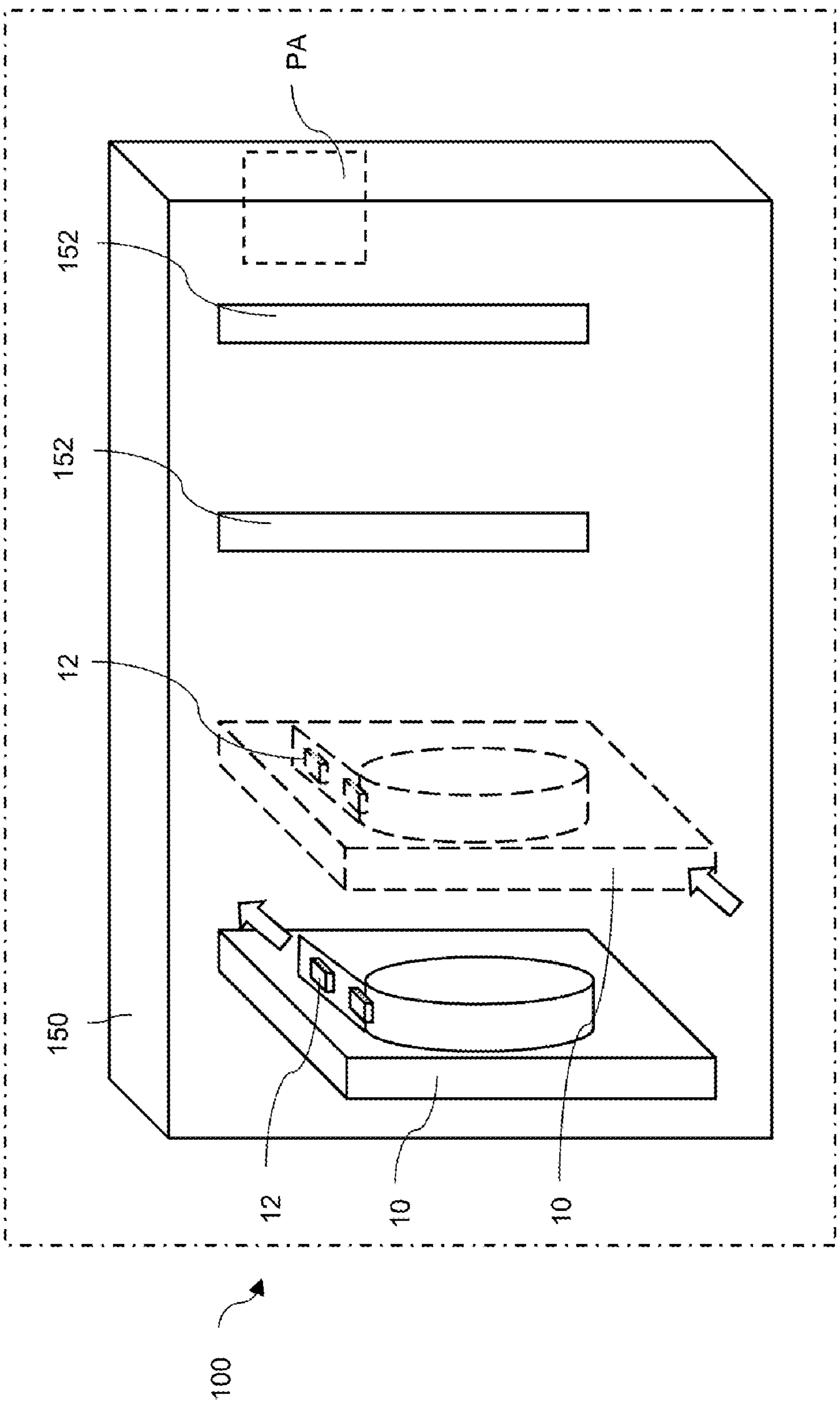

Determining (202) a run-out-time (t1) for a first feeder cartridge (10) within a first slot (152) of the placement device (150) by a supply system (100), Supplying (204) a second feeder cartridge (10) to a second slot (152) of the placement device (150) by the supply system (100) before the run-out-time (t1) of the first feeder cartridge (10) is reached, wherein the second feeder cartridge (10) includes the same SMT-components (12) as the first feeder cartridge (10).

Furthermore, the invention relates to a supply system (100) for supplying feeder cartridges (10) with SMT-components
(Continued)

(12) to a placement device (150) for the SMT-components (12), a computer program product (300) and a computer-readable medium (400).

10 Claims, 4 Drawing Sheets

(51) Int. Cl.
*H05K 13/02* (2006.01)
*H05K 13/04* (2006.01)
(52) U.S. Cl.
CPC ..... *H05K 13/0417* (2013.01); *H05K 13/0419* (2018.08); *H05K 13/046* (2013.01)

(56) References Cited

FOREIGN PATENT DOCUMENTS

| | | | | | |
|---|---|---|---|---|---|
| JP | 2005235952 | A | * | 9/2005 | |
| JP | 2011204824 | A | * | 10/2011 | |
| JP | 2017050473 | A | * | 3/2017 | |
| WO | WO-2019229924 | A1 | * | 12/2019 | ......... H05K 13/0857 |

OTHER PUBLICATIONS

JP-2011204824-A (Year: 2011).*
JP-2017050473-A (Year: 2017).*
WO-2019229924-A1 (Year: 2019).*

* cited by examiner

METHOD FOR SUPPLYING SMT-COMPONENTS WITHIN FEEDER CARTRIDGES, SUPPLY SYSTEM, COMPUTER PROGRAM PRODUCT AND COMPUTER-READABLE MEDIUM

The invention relates to a method for supplying SMT-components within feeder cartridges to a placement device for the SMT-components. The invention further relates to a supply system for supplying feeder cartridges with SMT-components to a placement device for the SMT-components, a computer program product for supplying feeder cartridges with SMT-components to a placement device for the SMT-components and a computer-readable medium on which the computer program product is stored.

The currently known supply processes for components, in particular SMT-components for the assembly of printed circuit boards (PCBs), involve extensive manual work steps by personnel. In the known state of the art, the components are usually provided rolled up on a reel via component tapes and/or belts. The component tapes and/or belts are usually moved forward by feeders and thus the components are supplied to the placement device. Up until now, the reels have usually been designed separately from the respective feeder, with a free front end of the component reel usually being inserted manually into the feeder. During a reel change or the transition between two reels, the free front end of a new component reel is usually spliced to the rear free end of the previous component reel to enable a continuous supply of components to the placement device. Modern component reels are designed as part of the feeder, for example within a feeder cartridge. The replenishment on SMT production lines by exchanging feeder cartridges is different from today's splicing process.

The splicing process doesn't need to wait until the reel is empty, so an operator has a much wider time window for the splicing process. The currently known process for exchanging a feeder cartridge advantageously is performed at a 'spot-time', which means at the time of a feeder cartridge running empty, a new feeder is replaced. Therefore, when the SMT-components are provided via feeder cartridges, currently there is a need for a replacement of the feeder cartridges, preferably after the last component of the respective feeder cartridge has been picked up. Advantageously, the exchange of the feeder cartridge is completed before the planned pick-up of a next SMT-component of the same type, in order to enable a smooth operation of the placement device. However, a disadvantage of known supply systems is that with a large numbers of feeder cartridges, overlapping replacement periods for the feeder cartridges occur and thereby disrupt a smooth and timely precise operation of the placement device.

In daily practice, many materials on a line have the same package and same consumption per PCB, which leads to many feeders running empty at the same time. Since there can be up to hundreds of feeders running on a production line, many feeders can run empty at the same or similar time. If multi-feeders run empty at different and/or the same placement device at the same or at a similar time, the exchange of the feeder cartridges can't be accomplished in time and production time will be lost.

Accordingly, it is an object of the invention to provide a method for supplying SMT-components within feeder cartridges to a placement device for the SMT-components, that overcome at least some of the aforementioned disadvantages in a convenient and cost-efficient way.

This object is solved by the subject matter of the claims. In particular, the object is solved by a method for supplying SMT-components within feeder cartridges to a placement device for the SMT-components as claimed, a supply system for supplying feeder cartridges with SMT-components to a placement device for the SMT-components as claimed, a computer program product for supplying feeder cartridges with SMT-components to a placement device for the SMT-components, and a computer-readable medium. Further details of the invention unfold from the other claims as well as the description and the drawings. Thereby, the features and details described in connection with the method for supplying SMT-components within feeder cartridges to a placement device for the SMT-components, the supply system, the computer program product and the computer-readable medium of the invention may be applied in connection with each other so that regarding the disclosure of the individual aspects of the invention it is or can be referred to one another.

According to a first aspect of the invention, the above-mentioned object is solved by a method for supplying SMT-components within feeder cartridges to a placement device for the SMT-components, the placement device having multiple slots for installing the feeder cartridges to transfer the SMT-components from each of the feeder cartridges to the placement device. The method comprising the following steps:

Determining a run-out-time for a first feeder cartridge within a first slot of the placement device by a supply system, Supplying a second feeder cartridge to a second slot of the placement device by the supply system before the run-out-time of the first feeder cartridge is reached, wherein the second feeder cartridge includes the same SMT-components as the first feeder cartridge.

The method steps described above and in the following can, if not explicitly stated otherwise, be carried out individually, together, once, several times, in parallel and/or consecutively in any order. A designation as, for example, "first method step" and "second method step" does not imply any chronological order and/or prioritization. A preferred order of the method steps comprises that the method steps are executed in the order listed.

The first feeder cartridge is to be understood as a currently in use feeder cartridge with respect to the placement device. Thereby the first slot of the placement device is occupied by the first feeder cartridge and the placement device is picking up SMT-components from the first feeder cartridge. The second feeder cartridge is to be understood as an exchange feeder cartridge for the first feeder cartridge. The second feeder cartridge contains the same SMT-components as the first feeder cartridge. The same SMT-components in the first feeder cartridge and the second feeder cartridge is to be understood as both feeder cartridges containing the same SMT-components to be provided to the placement device. The second slot is to be understood as a free slot of the placement device in which the second feeder cartridge is insertable. With respect to a large number of feeder cartridges in use with a typical placement device the first feeder cartridge, the second feeder cartridge as well as the first slot and the second slot are to be understood respectively for each combination of an in use first feeder cartridge and an exchange second feeder cartridge. The first slot and the second slot of the placement device is to be understood with regards to the respective feeder cartridges. The first slot and the second slot of the placement device can change within the multiple slots of the placement device with regards to different first feeder cartridges. Thereby, the definition of the first feeder cartridge, the second feeder cartridge as well as the first slot and the second slot are to be understood as relative definitions and not as absolute definitions. A supply system is preferably enabled to supply multiple second feeder cartridges to a placement device.

The run-out-time is to be understood as the time when the last SMT-component is taken from the first feeder cartridge. With other words, the run-out-time defines the time when the first feeder cartridge runs empty. The second feeder cartridge is supplied to the second slot of the placement device by the supply system before the run-out-time of the first feeder cartridge is reached. Thereby, a loss of production time of the placement device is avoided or minimized when the first feeder cartridge runs empty.

The method according to the invention is particularly advantageous because it enables the supplying of SMT-components within feeder cartridges to a placement device for the SMT-components in a convenient and cost-efficient way. The exchange of the feeder cartridges can be accomplished without or with a minimized loss of production time of the placement device.

The method may further comprise a step of changing a pickup-position of the SMT-components of the first feeder cartridge from the first feeder cartridge to the second feeder cartridge by the placement device and/or by the supply system when the run-out-time of the first feeder cartridge is reached. It is especially advantageous to change the pickup-position of the SMT-component of the first feeder cartridge from the first feeder cartridge to the second feeder cartridge. Preferably, the placement device and the supply system are connected to interchange data in order to communicate the new pickup-position for the SMT-components. Thereby the method according to the invention enables a continuous production by changing the pickup-position of the SMT-component of the first feeder cartridge from the first feeder cartridge to the second feeder cartridge by the placement device and/or by the supply system when the run-out-time of the first feeder cartridge is reached. Preferably, the supply system sends a signal to the placement device in which slot the second feeder cartridge is going to be or was inserted. Additionally or alternatively, the placement device is enabled to recognize, for example via a sensor unit, in which slot the second feeder cartridge was inserted.

The method may further comprise that the determining of the run-out-time comprises at least one of the following steps:

- Determining a consumption-rate for the SMT-components of the first feeder cartridge,
- Determining a number of the SMT-components of the first feeder cartridge,
- Determining an amount of free slots and/or free slots per placing head, especially wherein the supplying is timed in accordance to the determined amount of free slots.

It is especially advantageous to determine and/or to calculate at least one of the aforementioned data for the first feeder cartridge and/or the placement device. The determining can be understood as a determining of a current consumption-rate, number and/or amount of free slots and/or as a determining of a forecast of the consumption-rate, number and/or amount of free slots. It is especially preferable to supply the second feeder cartridge to the second slot of the placement device with regards to the determined consumption-rate, number and/or amount of free slots. For example, if the supply system has free capacity, by means of time and/or load, to supply further second feeder cartridges and the placement device has free slots for those second feeder cartridges, the second feeder cartridges can be supplied earlier, with a time buffer to the run-out-time of the respective first feeder cartridges in order to enable a balanced load factor of the supply system and/or to decrease the load factor of the supply system in the future. The aforementioned data can be determined and/or calculated once or continuously in constant or varying time intervals.

The method may further comprise a step of comparing the determined run-out-times for all feeder cartridges by the supply system in order to identify time supply conflicts. The comparing is preferably done by a computer unit of the supply system. A time supply conflict is to be understood as at least two run-out-times being too close to each other to enable the supply system to timely supply the respective feeder cartridges. A time supply conflict is preferably to be understood as a time conflict on a single production line level, for example when the supply system is supplying feeder cartridges to a single or multiple placement devices of a single production line, or on a multi production line level, for example when the supply system is supplying feeder cartridges to a single or multiple placement devices of a multiple production lines. For example, a time supply conflict does occur when two first feeder cartridges have run-out-times within a minute or less of a time gap in between the run-out-times. It is especially advantageous when the supplying comprises a preferred supplying of second cartridges for those first cartridges that are affected by a time supply conflict since those cartridges run out at the same or a similar time and thereby will result in a larger/longer loss of production time.

The method may further comprise that each first slot is assigned to a dedicated second slot and/or that at least two first slots are assigned to a shared second slot. It is especially advantageous when each first slot is assigned to a dedicated second slot, because it minimizes or avoids space conflicts when supplying a second feeder cartridge. In other cases, for example when space requirements and/or the number of available slots do not allow for a dedicated second slot for each first slot and/or when the consumption-rate of a SMT-component is low enough, a shared second slot for at least two first slots is assigned. A shared slot is to be understood as a second slot to which second feeder cartridges for the at least two first slots is supplied to. Preferably the second feeder cartridge is switched to the original first slot, after the first cartridge is removed and/or collected from the first slot. The shared second slot is preferably designed to take up more than one feeder cartridge.

Alternatively, the second feeder cartridges for the at least two first slots are supplied to the shared second slot one after the other, especially wherein only one second feeder cartridge can be installed in the shared second slot at a time.

The method may further comprise a step of removing and/or collecting the first feeder cartridge after the run-out-time of the first feeder cartridge is reached. It is preferred when slots of the placement device are being cleared of empty first feeder cartridges in order to enable the reuse of those feeder cartridges and/or in order to make space for supplying further second feeder cartridges to the placement device. It is especially advantageous when the supply system is removing and/or collecting multiple empty first feeder cartridges at once. The supply system preferably is enabled to determine the number of empty feeder cartridges in the slots of the placement device, especially wherein the removing of the first feeder cartridges is done with respect to a number of determined free slots and/or a determined number of empty feeder cartridges in the slots of the placement device.

The method may further comprise a step of prioritising of the supplying, changing and/or removing of the feeder cartridges according to at least one priority criterium by the supply system. It is an advantageous development of the method to prioritise the supplying, changing and/or removing of the feeder cartridges according to at least one priority criterium by the supply system. The at least one priority criterium preferably includes a time in between pickups of the SMT-component by the placement device, a time and/or a rate how often the feeder cartridge is running empty, a number of the SMT-component per PCB currently produced by the placement device and/or a number of SMT-components left in the feeder cartridge. A prioritising of the supplying, changing and/or removing of the feeder cartridges according to at least one priority criterium by the supply system enables the supply system to maximise the efficiency of the placement device and thereby to reduce the cost of the production by the placement device and the loss of production time.

The method may further comprise a step of synchronizing the supplying and/or the removing of the feeder cartridges with the operation of the placement device by the supply system. The supplying, the changing and/or the removing of the feeder cartridges usually generates vibrations and/or movements of the placement device. These vibrations and/or movements tend to have a negative influence on the accuracy of the placement of SMT-components by the placement device. Therefore, it is advantageous if the supplying and/or the removing of the feeder cartridges are synchronized, timed and/or performed in a coordinated manner between the supply system and the placement device so that the supplying and/or the removing of the feeder cartridges is performed at a time when, for example, no SMT-component is being placed and/or picked up by the placement device. Preferably, the supply system and the placement device are connected in a data-communicating manner to enable the synchronizing according to the invention. For example, a request is sent from the supply system to the placement device as to whether the supplying and/or the removing of the feeder cartridges may occur. The placement device may acknowledge, reject, and/or time-delay this request. The supply system can wait for a confirmation by the placement device and/or execute another process step if a specified time value is exceeded without confirmation. Thus, the method according to the invention advantageously prevents a negative influence on the accuracy of the placement of the SMT-components by the placement device or at least reduces an influence by the supplying and/or the removing of the feeder cartridges.

The method may further comprise a step of determining distances between at least two free slots of the placement device and the placement device, especially a placing area of the placement device, wherein the second feeder cartridge is supplied to the nearest of the at least two free slots. This advantageous enhancement of the inventive method enables short travel distances for the placing head of the placement device in between the placing area of the placement device and the provided SMT-component of a supplied second feeder cartridge. It is especially advantageous when at least one priority criterium as described before is taken into consideration as well. For example, when comparing at least two second feeder cartridges that need to be supplied to the placement device in the near future, it is preferred to place the second feeder cartridge with SMT-components that is used the most for the currently produced PCBs in a slot, which is closest to the placing area. In other words, the feeder cartridges with the highest consumption-rate for the SMT-components are preferably placed in the nearest slots with regards to the placing area of the placing device. Thereby the production efficiency of the placing device is increased and the travel time of the placing head between a pickup area and a placing area for the SMT-components is reduced.

According to a second aspect of the invention, the initially stated object is solved by a supply system for supplying feeder cartridges with SMT-components to a placement device for the SMT-components. The supply system is configured to execute the method according to the first aspect. With the supply system described, all the advantages already outlined with respect to the method according to the first aspect of the invention are obtained. The supply system preferably has movement devices. For example, the movement devices are designed as rail-guided movement devices or as freely movable movement devices. For example, the movement devices comprise gripping devices for interacting with, picking up and/or delivering the feeder cartridges. In the context of the invention, the supply system enables the feeder cartridges to be picked up, for example from a storage position and/or a preparation device, and subsequently being supplied to the placement device. Preferably, the devices of the supply system comprise communication devices, wherein the communication devices enable data communication between the devices. Preferably, the supply system utilizes the same moving devices for supplying and removing the feeder cartridges. Exemplarily, the motion devices are designed as moving robot devices with gripper arms for supplying and/or removing the feeder cartridges. The supply system preferably has a computer unit for executing the method steps at least in sections. The computer unit is preferably integrated in at least one of the movement devices and/or designed separately. Preferably, the computer unit is designed for controlling and/or regulating the movement devices of the supply system. Furthermore, the computer unit is preferably designed for detecting a utilization rate of the supply system, for example in order to adapt the timing of the supplying of the feeder cartridges as a function of the utilization rate of the supply system. A supply system configured in this way is particularly advantageous, since the supply system enables the smoothest possible supplying of SMT-components in feeder cartridges to the at least one placement device. Preferably, the supply system according to the invention is designed to supply a plurality of placement devices. The supply system according to the invention advantageously avoids or at least reduces waiting of a placement device for a supply process of a feeder cartridge. Preferably the placement device comprises a feeder table, especially wherein the feeder table is designed to install the feeder cartridges into it and/or the feeder table comprises the multiple slots. The feeder table is preferably designed to be attached and/or connected to a pickup unit and/or a placing unit of the placement device.

According to a third aspect of the invention, the initially stated object is solved by a computer program product for supplying feeder cartridges with SMT-components to a placement device for the SMT-components. The computer program product comprises instructions that cause the supply system according to the second aspect to perform the method according to the first aspect. With the computer program product described, all the advantages already outlined with respect to the method according to the first aspect of the invention as well as to the supply system according to the second aspect are obtained.

According to a fourth aspect of the invention, the initially stated object is solved by a computer-readable medium on which the computer program product according to the third aspect is stored. With the computer-readable medium described, all the advantages already outlined with respect to the method according to the first aspect of the invention as well as to the supply system according to the second aspect are obtained.

Figure 2:
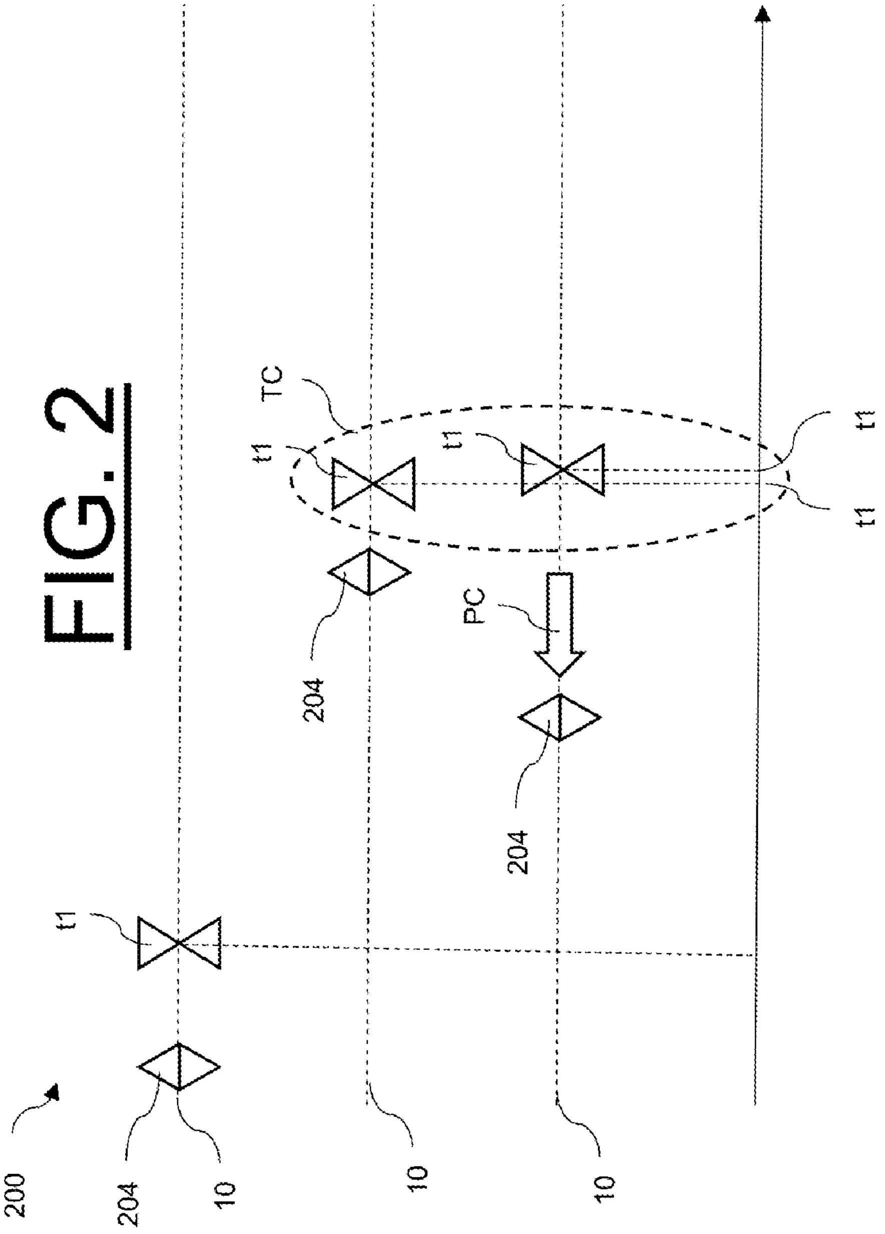
Figure 3:
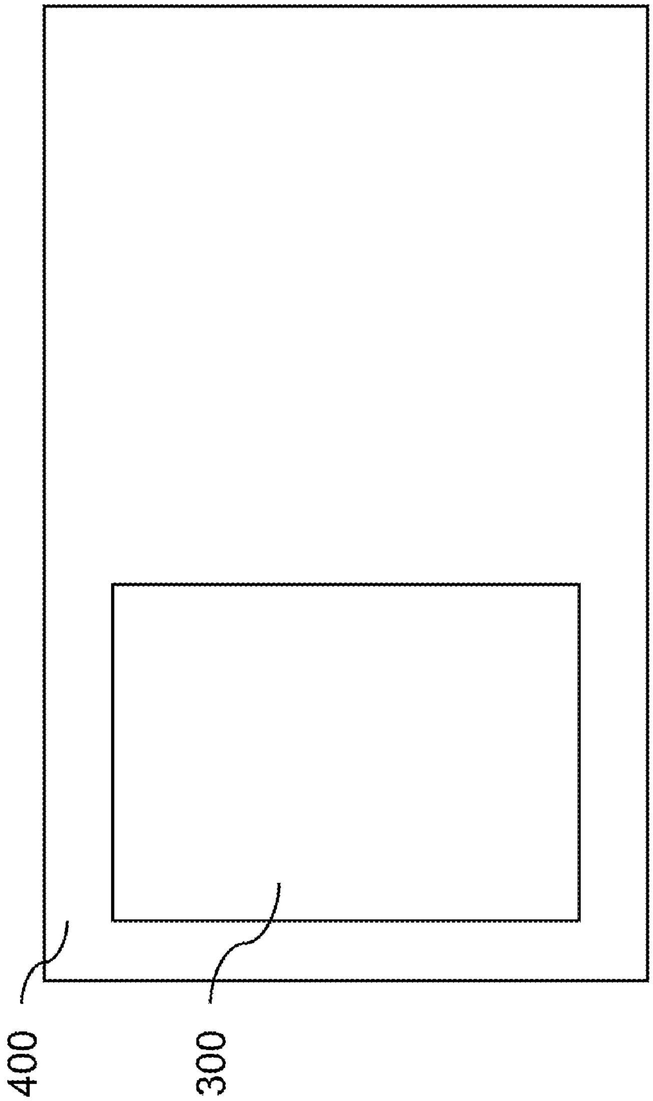
Figure 4:
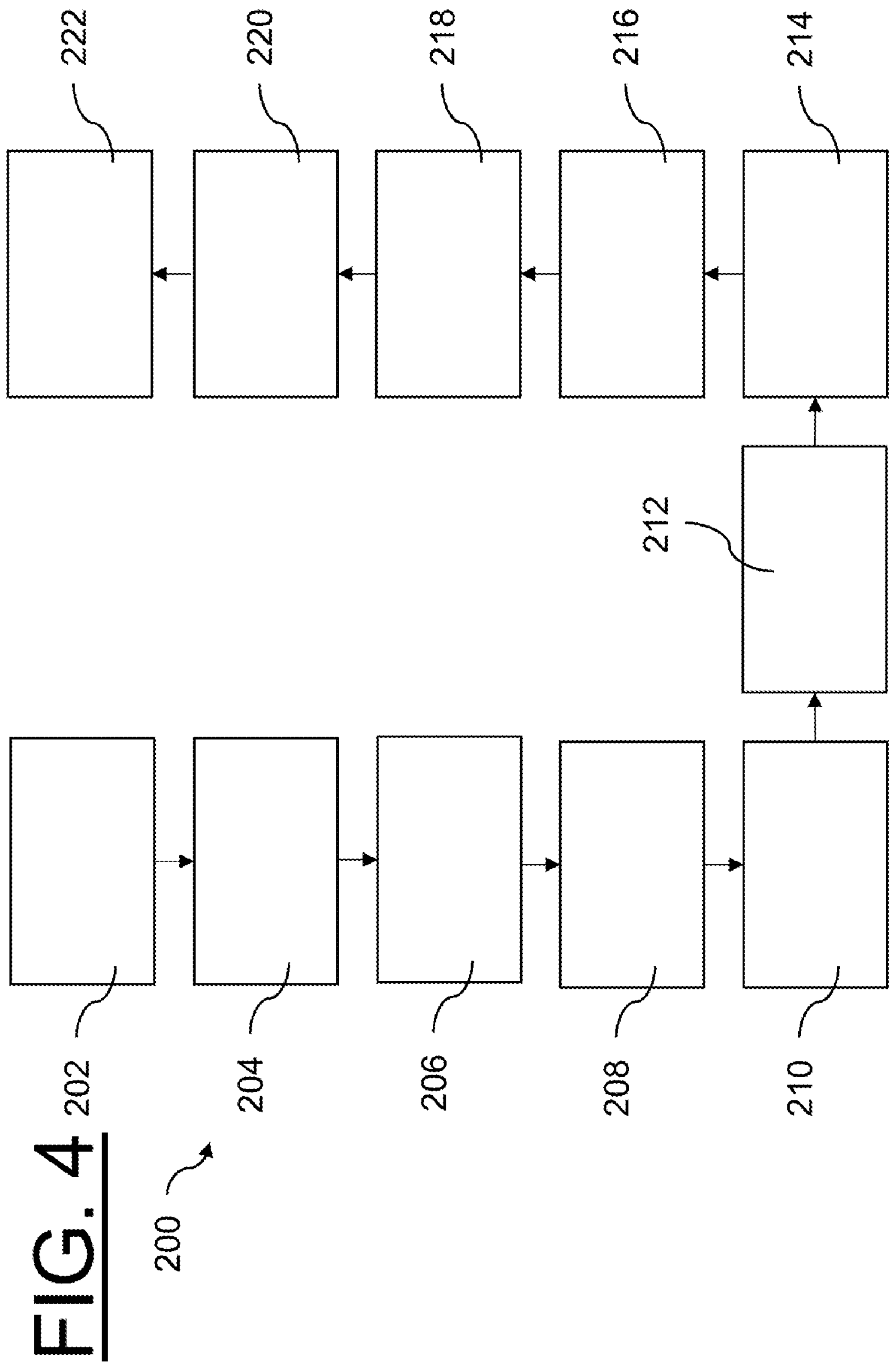

Further advantages, features and details of the invention unfold from the following description, in which by reference to drawings FIGS. 1 and 2, embodiments of the present invention are described in detail. Thereby, the features from the claims as well as the features mentioned in the description can be essential for the invention as taken alone or in an arbitrary combination. In the drawings, there is schematically shown:

FIG. 1 a schematic illustration of an embodiment of a supply system for supplying SMT-components in feeder cartridges to a placement device, FIG. 2 a schematic illustration of a time graph of three feeder cartridges and their run-out-times, FIG. 3 a schematic illustration of a computer program product and a computer-readable medium, and FIG. 4 a schematic illustration of an embodiment of the method of the invention.

The same objects in FIGS. 1 to 4 are labelled with the same reference number. The objects are shown in a schematic manner, and their specific dimensions are exemplary and may be enlarged for ease of reference only.

FIG. 1 shows a schematic illustration of an embodiment of a supply system 100 for supplying SMT-components 12 in feeder cartridges 10 to a placement device 150. The placement device 150 has multiple slots 152 for installing the feeder cartridges 10 to transfer the SMT-components 12 from each of the feeder cartridges 10 to the placement device 150. The supply system 100 is enabled to determine a run-out-time t1 (not shown) for a first feeder cartridge 10 within a first slot 152 of the placement device 150. Furthermore, the supply system 100 is enabled to supply a second feeder cartridge 10 to a second slot 152 of the placement device 150 by the supply system 100 before the run-out-time t1 (not shown) of the first feeder cartridge 10 is reached, wherein the second feeder cartridge 10 includes the same SMT-components 12 as the first feeder cartridge 10. Furthermore, the supply system 100 is enabled to change a pickup-position of the SMT-components 12 of the first feeder cartridge 10 from the first feeder cartridge 10 to the second feeder cartridge 10 when the run-out-time t1 (not shown) of the first feeder cartridge 10 is reached. Furthermore, the supply system 100 is enabled to determine distances between at least two free slots 152 of the placement device 150 and a placing area PA of the placement device 150, wherein the second feeder cartridge 10 is supplied to the nearest of the at least two free slots 152. In FIG. 2 the nearest slot 152 to the placing area PA is shown on the right.

FIG. 2 shows a schematic illustration of a time graph of three first feeder cartridges 10 and their run-out-times t1 as well as an embodiment of the method 200. The determined run-out-times t1 are compared for all feeder cartridges 10 by the supply system 100 (not shown) in order to identify time supply conflicts TC. In FIG. 2 a time supply conflict between the lower and the middle first feeder cartridge 10 is identified. The supplying 204 of a second feeder cartridge 10 for the lower first feeder cartridge 10 is prioritised according to a priority criterium PC by the supply system 100 (not shown). Thereby, the second feeder cartridge 10 for the lower first feeder cartridge 10 is supplied with a time buffer. The second feeder cartridges 10 for the middle and upper first feeder cartridges 10 are supplied 204 before the run-out-time t1 of the first feeder cartridges 10 is reached, wherein the second feeder cartridges 10 include the same SMT-components 12 (not shown) as the first feeder cartridges.

FIG. 3 shows a schematic illustration of a computer program product 300 and a computer-readable medium 400. The computer program product 300 is designed to supply feeder cartridges 10 with SMT-components 12 to a placement device 150 for the SMT-components 12 and comprises instructions that cause the supply system 100 according to the second aspect of the invention to perform the method 200 according to the first aspect of the invention. The computer-readable medium 400 stores the computer program product 300 according to the third aspect of the invention.

FIG. 4 shows a schematic flow diagram of an embodiment of the method 200 of the invention. For improved clarity, only the reference signs of the method steps are indicated in FIG. 4. In a first step, the method 200 comprises determining 202 a run-out-time t1 for a first feeder cartridge 10 within a first slot 152 of the placement device 150 by a supply system 100. In a further step, the method 200 comprises supplying 204 a second feeder cartridge 10 to a second slot 152 of the placement device 150 by the supply system 100 before the run-out-time t1 of the first feeder cartridge 10 is reached, wherein the second feeder cartridge 10 includes the same SMT-components 12 as the first feeder cartridge 10. In a further step, the method 200 comprises changing 206 a pickup-position of the SMT-component 12 of the first feeder cartridge 10 from the first feeder cartridge 10 to the second feeder cartridge 10 by the placement device 150 and/or by the supply system 100 when the run-out-time t1 of the first feeder cartridge 10 is reached. In a further step, the method 200 comprises removing 208 the first feeder cartridge 10 after the run-out-time t1 of the first feeder cartridge 10 is reached. In a further step, the method 200 comprises removing 208 the first feeder cartridge 10 after the run-out-time t1 of the first feeder cartridge 10 is reached. In a further step, the method 200 comprises prioritising 210 of the supplying 204, changing 206 and/or removing 208 of the feeder cartridges 10 according to at least one priority criterium PC by the supply system 100. In a further step, the method 200 comprises synchronizing 212 the supplying 204, the changing 206 and/or the removing 208 of the feeder cartridges 10 with the operation of the placement device 150 by the supply system 100. In a further step, the method 200 comprises determining 214 distances between at least two free slots 152 of the placement device 150 and the placement device 150, especially a placing area PA of the placement device 150, wherein the second feeder cartridge 10 is supplied to the nearest of the at least two free slots 152. In a further step, the method 200 comprises comparing 216 the determined run-out-times t1 for all feeder cartridges 10 by the supply system 100 in order to identify time supply conflicts TC. In a further step, the method 200 comprises determining 218 a consumption-rate for the SMT-components of the first feeder cartridge 10. In a further step, the method 200 comprises determining 220 of a number of the SMT-components of the first feeder cartridge 10. In a further step, the method 200 comprises determining 222 of an amount of free slots 152, especially wherein the supplying 204 is timed in accordance to the determined amount of free slots 152.

REFERENCE SIGNS

10 feeder cartridge
12 SMT-components

100 supply system
150 placement device
152 slot
200 method
202 determining
204 supplying
206 changing
208 removing
210 prioritising
212 synchronizing
214 determining
216 comparing
218 determining
220 determining
222 determining
300 computer program product
400 computer-readable medium
t1 run-out-time
PA placing area
PC priority criterium
TC time supply conflict

The invention claimed is:

1. Method for supplying surface mount technology (SMT)-components within feeder cartridges to a placement device for the SMT-components, the placement device having multiple slots for installing the feeder cartridges to transfer the SMT-components from each of the feeder cartridges to the placement device, the method comprising the following steps:

Determining a run-out-time (tl) for a first feeder cartridge within a first slot of the placement device by a supply system, Supplying a second feeder cartridge to a second slot of the placement device by the supply system before the run-out-time (tl) of the first feeder cartridge is reached, wherein the second feeder cartridge includes the same SMT-components as the first feeder cartridge, Determining distances between at least two free slots of the placement device and a placing area of the placement device in which the SMT-components are to be placed, wherein the second feeder cartridge is supplied to the free slot of the at least two free slots which is nearest to the placing area.

2. Method according to claim 1, wherein the method further comprises:

Changing a pickup-position of the SMT-components of the first feeder cartridge from the first feeder cartridge to the second feeder cartridge by the placement device and/or by the supply system when the run-out-time (t1) of the first feeder cartridge is reached.

3. Method according to claim 1, wherein the determining of the run-out-time (t1) comprises at least one of the following steps:

Determining a consumption-rate for the SMT-components of the first feeder cartridge, Determining a number of the SMT-components of the first feeder cartridge, Determining an amount of free slots, especially wherein the supplying is timed in accordance to the determined amount of free slots.

4. Method according to claim 1, wherein the method further comprises:

Comparing the determined run-out-times (t1) for all feeder cartridges by the supply system in order to identify time supply conflicts (TC).

5. Method according to claim 1, wherein each first slot is assigned to a dedicated second slot and/or that at least two first slots are assigned to a shared second slot.

6. Method according to claim 1, wherein the method further comprises:

Removing the first feeder cartridge after the run-out-time (t1) of the first feeder cartridge is reached.

7. Method according to claim 1, wherein the method further comprises:

Prioritising of the supplying, changing and/or removing of the feeder cartridges according to at least one priority criterium (PC) by the supply system.

8. Method according to claim 1, wherein the method further comprises:

Synchronizing the supplying, the changing and/or the removing of the feeder cartridges with the operation of the placement device by the supply system.

9. Supply system for supplying feeder cartridges with SMT-components to a placement device for the SMT-components, wherein the supply system is configured to execute the method according to claim 1.

10. A non-transitory computer-readable medium on which a computer program product for supplying feeder cartridges with SMT-components to a placement device for the SMT-components is stored, wherein the computer program product comprises instructions that cause a supply system to perform the method according to claim 1, and wherein the supply system supplies feeder cartridges with SMT-components to a placement device for the SMT-components.

* * * * *